US012766640B2

(12) United States Patent
Nakamura

(10) Patent No.: US 12,766,640 B2
(45) Date of Patent: Oct. 20, 2026

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 297 days.

(21) Appl. No.: 18/797,727

(22) Filed: Aug. 8, 2024

(65) Prior Publication Data

US 2025/0073820 A1 Mar. 6, 2025

(30) Foreign Application Priority Data

Aug. 28, 2023 (JP) ................................ 2023-137742

(51) Int. Cl.
*B23K 26/53* (2014.01)
*H10P 74/20* (2026.01)
*H10P 90/00* (2026.01)

(52) U.S. Cl.
CPC ............ *B23K 26/53* (2015.10); *H10P 74/203* (2026.01); *H10P 90/123* (2026.01); *H10P 90/124* (2026.01)

(58) Field of Classification Search
None
See application file for complete search history.

(56) References Cited

U.S. PATENT DOCUMENTS

2014/0073067 A1* 3/2014 Uchida .................. H10P 54/00 438/5
2016/0315011 A1* 10/2016 Ogawa .................... H10P 54/00
2017/0207181 A1* 7/2017 Nakamura .............. H10P 34/42
2019/0378759 A1* 12/2019 Sugiya ................ B24B 27/0023
2020/0266103 A1* 8/2020 Sekiya .................... B32B 17/10
2021/0090954 A1* 3/2021 Mori ....................... H10P 54/00

FOREIGN PATENT DOCUMENTS

JP 2009081333 A 4/2009

* cited by examiner

*Primary Examiner* — Khaja Ahmad
(74) *Attorney, Agent, or Firm* — Greer Burns & Crain Ltd.

(57) ABSTRACT

A wafer processing method includes sticking a protective tape to a front surface of a wafer, applying a laser beam to the wafer from a back surface of the wafer to thereby form trial modified layers, dividing the wafer to form a sample piece, bending the sample piece to the protective tape side to expose a section, imaging the section, and measuring the positions of the trial modified layers, thereby generating measurement data. Thereafter, appropriate positions inside the wafer at which to position a focal point of the laser beam are set based on the measurement data. The laser beam is applied to the wafer with the focal point of the laser beam positioned at the positions thus set, to thereby form modified layers, and an external force is exerted on streets to divide the wafer into individual device chips.

3 Claims, 6 Drawing Sheets

WAFER PROCESSING METHOD

BACKGROUND OF THE INVENTION

Field of the Invention

The present invention relates to a wafer processing method for processing a wafer formed on its front surface with a device layer in which a plurality of devices are formed in the state of being partitioned by a plurality of projected dicing lines that intersect (hereinafter referred to as streets).

Description of the Related Art

The wafer formed on its front surface with a plurality of devices such as integrated circuits (ICs) and large-scale integration (LSI) circuits in the state of being partitioned by the plurality of intersecting streets is divided by a laser processing apparatus into individual device chips, and the device chips thus divided are utilized for electric apparatuses such as mobile phones and personal computers.

The laser processing apparatus includes a chuck table that holds the wafer, a laser beam applying unit that applies a laser beam of such a wavelength as to be transmitted through the wafer to the wafer held by the chuck table, with a focal point of the laser beam set at positions inside the wafer corresponding to the streets, to form modified layers to be used as start points of division, a feeding mechanism that moves the chuck table and the laser beam applying unit relative to each other, and an imaging unit that images the wafer held by the chuck table to detect the streets (see, for example, Japanese Patent Laid-open No. 2009-81333). Then, an external force is exerted on the wafer thus formed with the modified layers by the laser processing apparatus, to divide the wafer into individual device chips.

SUMMARY OF THE INVENTION

If the position of the focal point of the laser beam is unsuitable at the time of subjecting the wafer to laser processing, the devices formed on the front surface of the wafer may be damaged. The devices are configured with a plurality of circuits stacked therein, and hence, even when the manufacturer and the kind of the devices are the same, the thickness of the device layer may vary subtly. Due to the slight difference in the thickness of the device layer, the position of the focal point of the laser beam may become unsuitable, and the devices may be damaged.

Accordingly, it is an object of the present invention to provide a wafer processing method by which it is possible to position a focal point of a laser beam at an appropriate position.

In accordance with an aspect of the present invention, there is provided a wafer processing method for processing a wafer formed on a front surface thereof with a device layer in which a plurality of devices are formed in a state of being partitioned by a plurality of intersecting streets, the wafer processing method including a protective tape sticking step of sticking a protective tape to the front surface of the wafer, a trial modified layer forming step of applying a laser beam of such a wavelength as to be transmitted through the wafer to the wafer from a back surface of the wafer with a focal point of the laser beam positioned inside the wafer, to thereby form a trial modified layer, a sample piece forming step of exerting an external force along the trial modified layer to divide the wafer and form a sample piece, a measurement data generating step of bending the sample piece to the protective tape side to expose a section of the sample piece, imaging the section by an imaging unit, and measuring position of the trial modified layer in a thickness direction of the wafer and a thickness of the device layer to generate measurement data, a focal point position setting step of setting appropriate position inside the wafer at which to position the focal point of the laser beam, based on the measurement data, a modified layer forming step of returning the sample piece into its original state and applying the laser beam to the wafer with the focal point of the laser beam positioned at the position set by the focal point position setting step, to thereby form modified layer, and a dividing step of exerting an external force on the streets to divide the wafer into individual device chips.

Preferably, in the trial modified layer forming step, the trial modified layer is formed in a peripheral surplus region of the wafer. Preferably, in the dividing step, the back surface of the wafer is ground with use of grindstones to thin the wafer, and the wafer is divided into the individual device chips by an external force exerted by the grinding.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
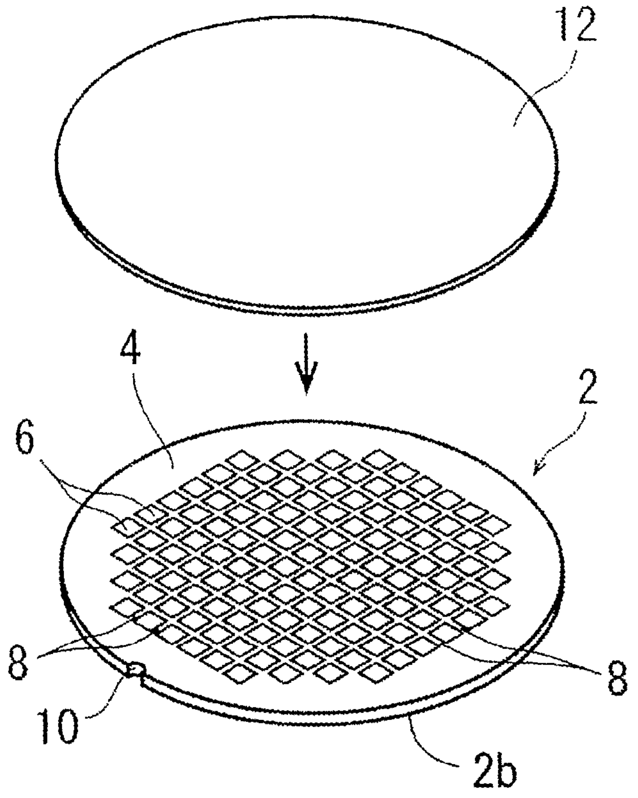
FIG. 1A is a perspective view of a wafer and a protective tape.
Figure 1B:
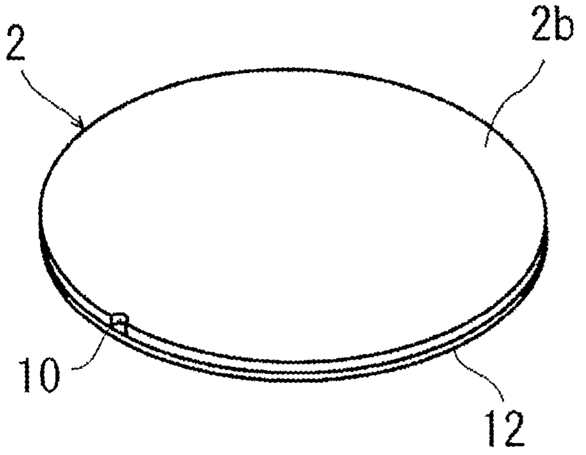
FIG. 1B is a perspective view of the wafer with the protective tape stuck to a front surface of the wafer, as viewed from a back surface side of the wafer.

A wafer processing method according to an embodiment of the present invention will be described below with reference to the drawings. FIGS. 1A and 1B depict a disk-shaped wafer 2 to be subjected to processing by the wafer processing method according to the present invention. The wafer 2 can be formed from a suitable semiconductor material such as silicon. A device layer 4 is formed on a front surface of the wafer 2, and, in the device layer 4, a plurality of devices 6 such as ICs and LSIs are partitioned by streets 8 formed in a grid pattern. In addition, a peripheral edge of the wafer 2 is provided with a notch 10 that indicates crystal orientation. Note that the thickness of the whole part of the wafer 2 inclusive of the device layer 4 is on the order of 300 μm, for example.

In the present embodiment, first, a protective tape sticking step of sticking a protective tape to the front surface of the wafer 2 is carried out. As depicted in FIGS. 1A and 1B, the protective tape 12 may be in the shape of a circle having a diameter substantially equal to that of the wafer 2. In addition, the protective tape 12 may be a pressure sensitive adhesive tape having a pressure sensitive adhesive layer (glue layer) on one side thereof, or may be a thermocompression bonding sheet that does not have a pressure sensitive adhesive layer. The thermocompression bonding sheet is a sheet of thermoplastic synthetic resin (for example, polyolefin-based resin) that is softened or melted to exhibit a sticking force when heated to a temperature in the vicinity of the melting point thereof.

After the protective tape sticking step is carried out, a trial modified layer forming step is carried out in which a laser beam of such a wavelength as to be transmitted through the wafer 2 is applied to the wafer 2 from a back surface 2*b* of the wafer 2, with a focal point of the laser beam positioned inside the wafer 2, to form a trial modified layer.

Figure 2:
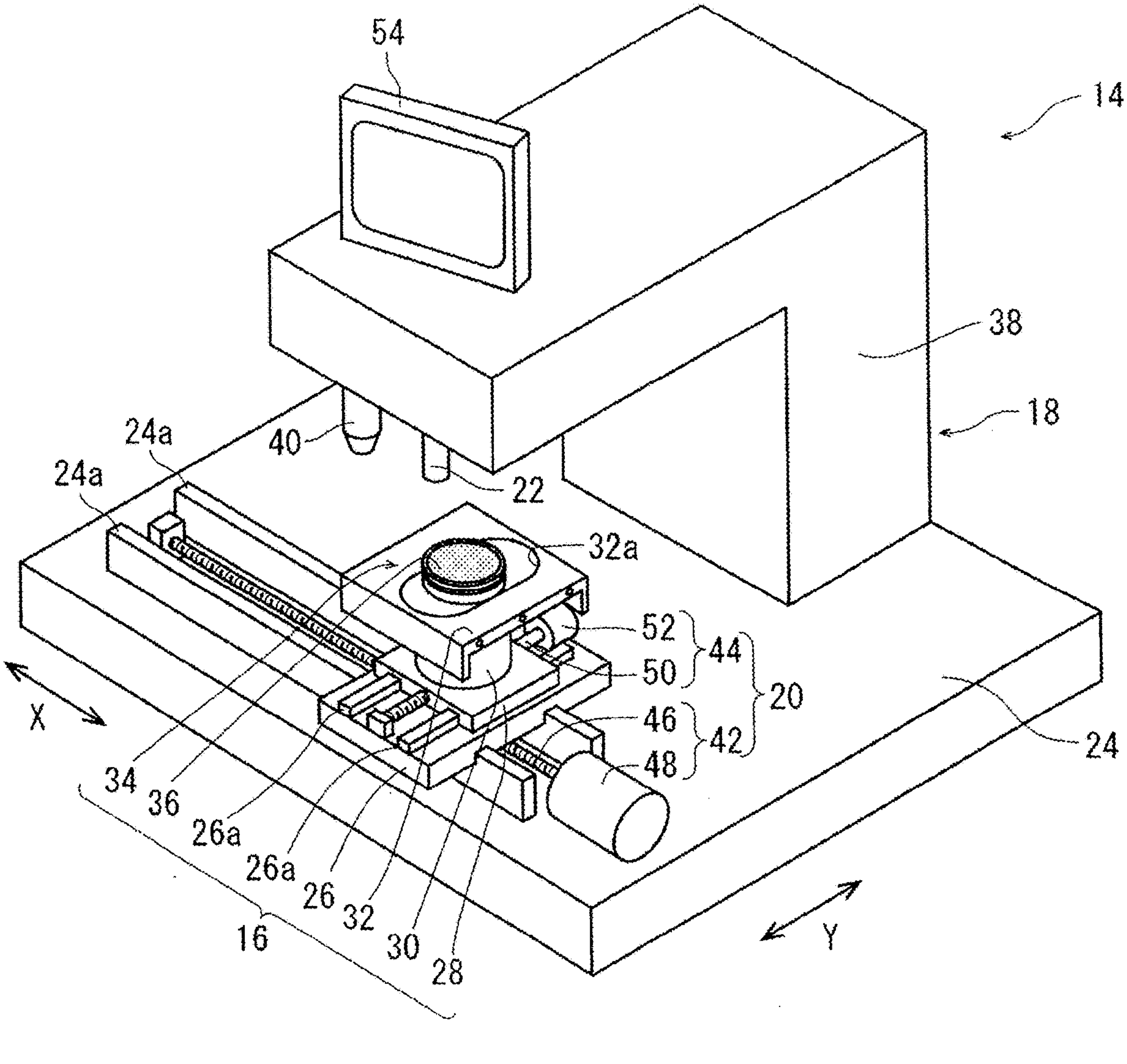
FIG. 2 is a perspective view of a laser processing apparatus.

The trial modified layer forming step can be carried out by use of, for example, a laser processing apparatus 14 depicted in FIG. 2. The laser processing apparatus 14 includes a holding unit 16 that holds the wafer 2, a laser beam applying unit 18 that applies a laser beam to the wafer 2 held by the holding unit 16, a feeding mechanism 20 that moves the holding unit 16 and the laser beam applying unit 18 relative to each other, and an imaging unit 22 that images the wafer 2 held by the holding unit 16, to detect the streets 8.

The holding unit 16 includes an X-axis movable plate 26 supported on an upper surface of a base 24 in such a manner as to be movable in an X-axis direction, a Y-axis movable plate 28 supported on an upper surface of the X-axis movable plate 26 in such a manner as to be movable in a Y-axis direction, a support column 30 fixed on an upper surface of the Y-axis movable plate 28, and a cover plate 32 fixed to an upper end of the support column 30. The cover plate 32 is formed with a slot 32*a* extending in the Y-axis direction, and a chuck table 34 extending upward through the slot 32*a* is rotatably mounted to the upper end of the support column 30. A circular porous suction chuck 36 connected to suction means (not illustrated) is disposed at an upper end part of the chuck table 34. In the holding unit 16, a suction force is generated on an upper surface of the suction chuck 36 by the suction means, to thereby hold under suction the wafer 2 placed on an upper surface of the chuck table 34. In addition, the chuck table 34 is configured to be rotatable by a chuck table motor (not illustrated) incorporated in the support column 30.

Note that the X-axis direction is a direction indicated by an arrow X in FIG. 2, and the Y-axis direction is a direction indicated by an arrow Y in FIG. 2 and orthogonal to the X-axis direction. An XY plane defined by the X-axis direction and the Y-axis direction is substantially horizontal.

The laser beam applying unit 18 includes a housing 38 extending upward from the upper surface of the base 24 and then extending substantially horizontally, a laser oscillator (not illustrated) incorporated in the housing 38, and a beam condenser 40 disposed on a lower surface of a tip of the housing 38. The laser oscillator emits a pulsed laser beam LB of such a wavelength as to be transmitted through the wafer 2. The beam condenser 40 focuses the pulsed laser beam LB emitted by the laser oscillator, to apply the pulsed laser beam LB to the wafer 2 held by the holding unit 16.

The feeding mechanism 20 includes an X-axis feeding mechanism 42 that moves the chuck table 34 in the X-axis direction, and a Y-axis feeding mechanism 44 that moves the chuck table 34 in the Y-axis direction.

The X-axis feeding mechanism 42 has a ball screw 46 connected to the X-axis movable plate 26 and extending in the X-axis direction, and a motor 48 that rotates the ball screw 46. The X-axis feeding mechanism 42 converts a rotational motion of the motor 48 into a rectilinear motion and transmits the rectilinear motion to the X-axis movable plate 26 by the ball screw 46, and moves the X-axis movable plate 26 in the X-axis direction along a pair of guide rails 24*a* on the base 24. As a result, the chuck table 34 is moved in the X-axis direction.

The Y-axis feeding mechanism 44 has a ball screw 50 connected to the Y-axis movable plate 28 and extending in the Y-axis direction, and a motor 25 that rotates the ball screw 50. The Y-axis feeding mechanism 44 converts a rotational motion of the motor 52 into a rectilinear motion and transmits the rectilinear motion to the Y-axis movable plate 28 by the ball screw 50, and moves the Y-axis movable plate 28 in the Y-axis direction along a pair of guide rails 26*a* on the X-axis movable plate 26. As a result, the chuck table 34 is moved in the Y-axis direction.

The imaging unit 22 is mounted to the lower surface of the tip of the housing 38, with a spacing between itself and the beam condenser 40. Though not illustrated, the imaging unit 22 includes an ordinary imaging device (charge coupled device or CCD) that images the wafer 2 by use of visible beams, an infrared (IR) ray applying unit that applies IR rays that are transmitted through the wafer 2, an optical system that captures the IR rays applied by the IR ray applying unit, and an imaging device (IR CCD) that outputs an electrical signal corresponding to the IR rays captured by the optical system. In addition, a monitor 54 that displays an image picked up by the imaging unit 22 is disposed on an upper surface of the housing 38.

Figure 3A:
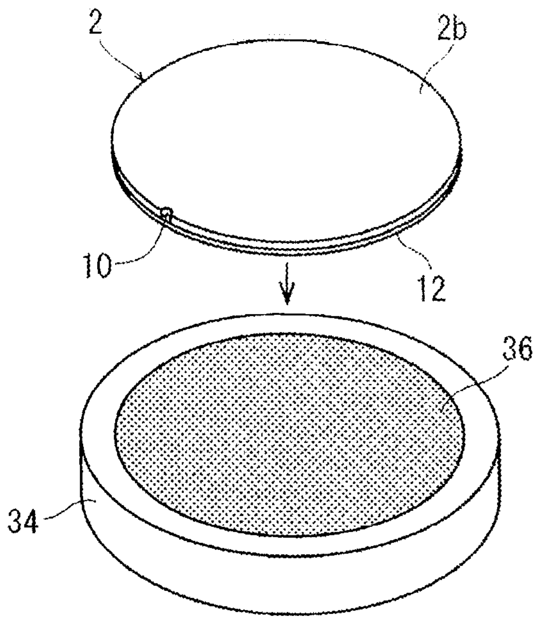
FIG. 3A is a perspective view depicting how the wafer depicted in FIG. 1B is placed on a chuck table.

In the trial modified layer forming step, first, the wafer 2 is held under suction by the chuck table 34. As depicted in FIG. 3A, the wafer 2 is placed on the upper surface of the chuck table 34 with the back surface 2*b* of the wafer 2 directed upward, and the suction means is then actuated to generate a suction force on the upper surface of the suction chuck 36. In this manner, the wafer 2 is held under suction by the chuck table 34.

After the wafer 2 is held under suction by the chuck table 34, a focal point of the laser beam LB is positioned inside the wafer 2. First, the feeding mechanism 20 is actuated to position the wafer 2 at a position directly under the imaging unit 22, and the wafer 2 is imaged by the imaging unit 22. Next, based on the image of the wafer 2, a positional relation between the beam condenser 40 and the wafer 2 is adjusted to set the focal point of the laser beam LB at a position inside the wafer 2 on a peripheral side of the wafer 2. The heightwise position of the focal point in this instance is a position that is on the device layer 4 side (on a lower surface side in the wafer 2) but that does not reach the device layer 4 (a position on an upper side as compared to the device layer 4).

Figure 3B:
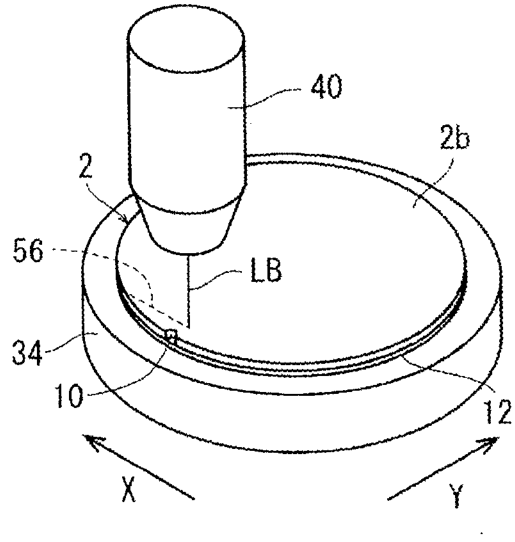
FIG. 3B is a perspective view depicting a trial modified layer forming step.

After the positioning of the focal point is performed, the laser beam LB is applied to the wafer 2 to form a trial modified layer on the lower surface side in the wafer 2. Specifically, while the chuck table 34 is being fed in the X-axis direction, as depicted in FIG. 3B, the laser beam LB of such a wavelength as to be transmitted through the wafer 2 is applied from the beam condenser 40 to the wafer 2. As a result, a trial modified layer 56 in a rectilinear shape as a whole can be formed on the lower surface side in the wafer 2.

After the trial modified layer 56 is formed on the lower surface side in the wafer 2, another trial modified layer 56 is further formed on the upper side of the trial modified layer 56. In other words, after the position of the focal point is raised by an appropriate amount, the laser beam LB is applied to the wafer 2 while the chuck table 34 is being fed in the X-axis direction, so that another trial modified layer 56 is formed on the upper side of the trial modified layer 56 that has been formed earlier. In this manner, the formation of the trial modified layer 56 is repeated to form a plurality of (for example, three) trial modified layers 56 at intervals in a vertical direction.

In the trial modified layer forming step, it is preferable to form the trial modified layers 56 in a peripheral surplus region of the wafer 2. The peripheral surplus region of the wafer 2 means a region which is on the peripheral side of the wafer 2 and in which the device layer 4 is present but no device 6 is formed. With the trial modified layers 56 thus formed in the peripheral surplus region, damaging of the devices 6 due to the formation of the trial modified layers 56 is prevented.

Such a trial modified layer forming step as described above can be carried out, for example, under the following processing conditions.

Wavelength of pulsed laser beam: 1,342 nm
Average output: 1.0 W
Repetition frequency: 90 KHz
Feed rate: 700 mm/s After the trial modified layer forming step is carried out, a sample piece forming step is carried out in which an external force is exerted along the trial modified layers 56 to divide the wafer 2 and form a sample piece.

In the sample piece forming step, an external force can be exerted on the trial modified layers 56 in a state in which the wafer 2 is placed on the chuck table 34. Alternatively, the external force may be exerted on the trial modified layers 56 after cancelling the suction force acting on the chuck table 34 to detach the wafer 2 from the chuck table 34 and placing the wafer 2 on another working table. For exertion of the external force, for example, an automatic punch (not illustrated) with a hammer incorporated therein can be used.

Figure 4:
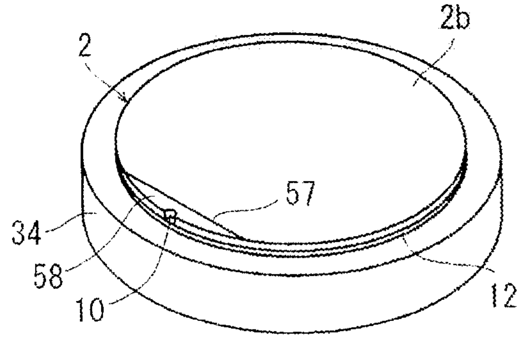
FIG. 4 is a perspective view of the wafer formed with a sample piece.

With the external force exerted along the trial modified layers 56, a division groove 57 extending from the back surface **2*b* of the wafer 2 to the device layer 4 (the front surface of the wafer 2) is formed along the trial modified layers 56, as depicted in FIG. 4. As a result, the wafer 2 can be divided to form the sample piece 58. In this instance, though the wafer 2 is divided, the protective tape 12 is not divided. Hence, the wafer 2 and the sample piece 58 are linked to each other through the protective tape 12**.

After the sample piece forming step is carried out, a measurement data generating step is carried out in which the sample piece 58 is bent to the protective tape 12 side to expose a section, the section is imaged by the imaging unit 22 to measure the positions of the trial modified layers 56 in the thickness direction of the wafer 2 and the thickness of the device layer 4, thereby generating measurement data.

Figure 5:
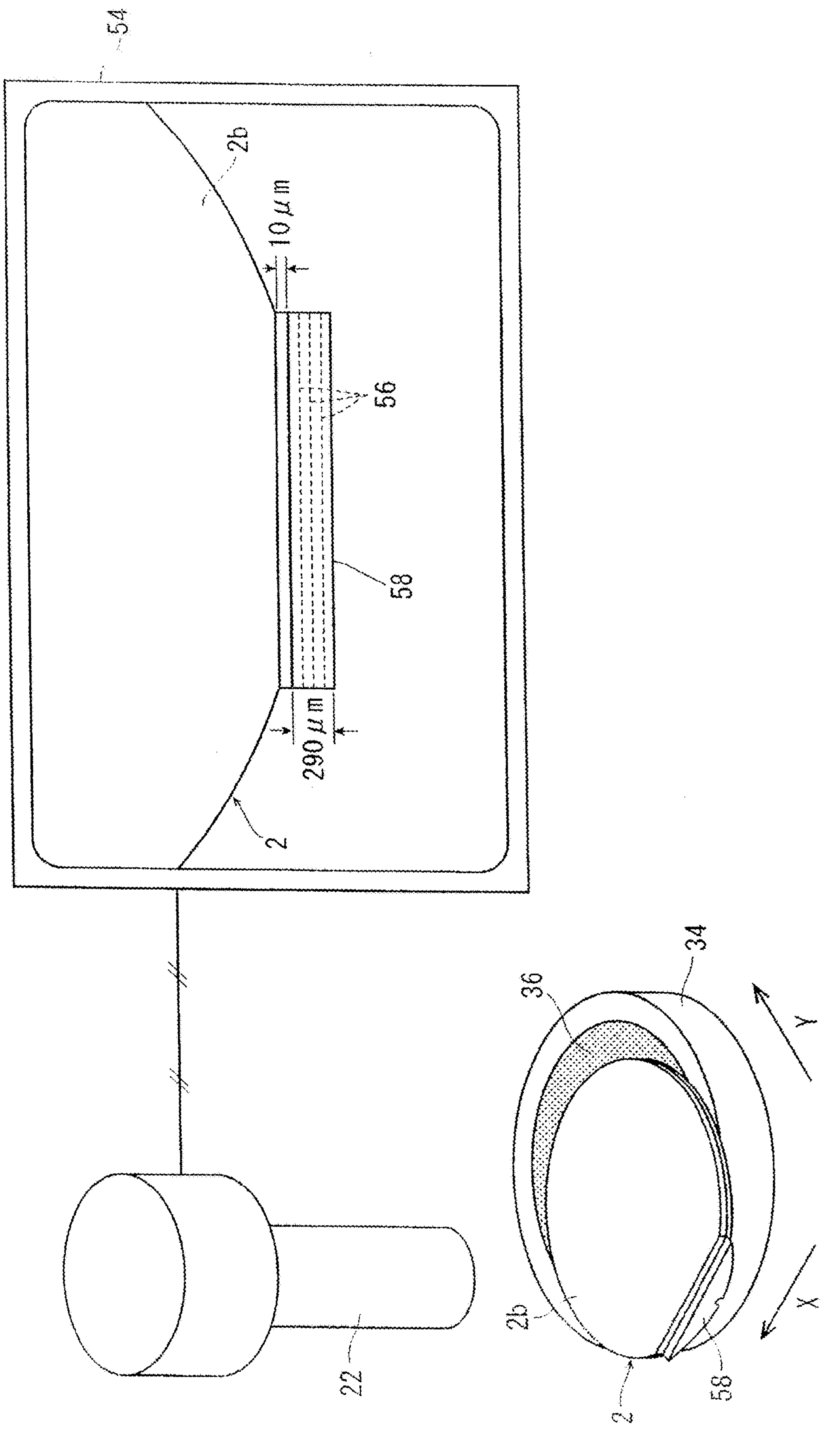
FIG. 5 is a schematic diagram depicting a measurement data generating step.

In the measurement data generating step, first, the section of the sample piece 58 is exposed by an operator. Specifically, the position of the wafer 2 is shifted on the chuck table 34, to position the sample piece 58 to the outside of the chuck table 34. Next, as depicted in FIG. 5, the sample piece 58 is bent to the protective tape 12 side. In this way, the section of the sample piece 58 (the section of the division groove 57) is exposed to the upper side.

After the section of the sample piece 58 is exposed, the exposed section of the sample piece 58 is imaged. Specifically, first, the chuck table 34 is moved to position the sample piece 58 at a position directly under the imaging unit 22. Next, as depicted in FIG. 5, the section of the sample piece 58 that is exposed to the upper side is imaged by the imaging unit 22, and the image thus obtained by the imaging is displayed on the monitor 54. It is to be noted that, in FIG. 5, the section of the sample piece 58 and the wafer 2 displayed on the monitor 54 are in the state of being exaggerated for convenience' sake.

After the section of the sample piece 58 is imaged, the measurement data are generated based on the picked-up image of the sample piece 58. At the time of generating the measurement data, suitable image analysis software can be used. The positions of the trial modified layers 56 in the thickness direction of the wafer 2 and the thickness of the device layer 4 are measured to generate the measurement data. The measurement data generated here are, for example, as follows.

Positions of trial modified layers: 100 μm, 170 μm, and 250 μm from lower surface of wafer
Thickness of device layer: 10 μm After the measurement data generating step is carried out, a focal point position setting step is carried out for setting an appropriate position inside the wafer 2 at which to position the focal point of the laser beam LB based on the measurement data. A rough thickness of the device layer 4 is recognized beforehand, but an accurate thickness of the device layer 4 may subtly vary from wafer 2 to wafer 2 or from lot to lot of the wafers 2. Further, the appropriate heightwise position of the focal point of the laser beam varies depending on the thickness of the device layer 4. In view of this, in the present embodiment, the position of the focal point of the laser beam LB is set based on the measurement data.

The setting of the focal point position may be automatically performed by a computer or may be carried out by the operator. In the case where the computer performs the setting mentioned above, a relation between the thickness of the device layer 4 and the appropriate position of the focal point is determined in advance by experiments or the like, and the measured thickness of the device layer 4 is put into this relation, so that the appropriate position of the focal point can be deduced. As for the relation described above, it is preferable to register a plurality of relations in the computer in advance according to the materials and thicknesses of the wafers 2. On the other hand, in the case where the operator performs the setting described above, after an appropriate position of the focal point is deduced by the computer, the deduced position may be corrected as appropriate taking into account the image of the section of the sample piece 58, so that the position of the focal point can be set.

In the focal point position setting step, the number of the focal point positions may be modified from that in the trial modified layer forming step. For example, while the number of the focal point positions in the trial modified layer forming step is three (1:100 μm, 2:170 μm, 3:250 μm) in the above-described example, the number of the focal point positions may be set to four (1:60 μm, 2:130 μm, 3:190 μm, 4:230 μm) in the focal point position setting step. Note that the numerical values mentioned above are all numerical values based on the lower surface of the wafer 2 as a reference.

After the focal point position setting step is carried out, a modified layer forming step is carried out in which the sample piece 58 is returned into its original state, and the laser beam LB is applied to the wafer 2 with the focal point of the laser beam LB positioned at the positions set in the focal point position setting step, to thereby form modified layers. The modified layer forming step can be carried out by use of an apparatus for carrying out the trial modified layer forming step (for example, the laser processing apparatus 14 depicted in FIG. 2).

Figure 6:
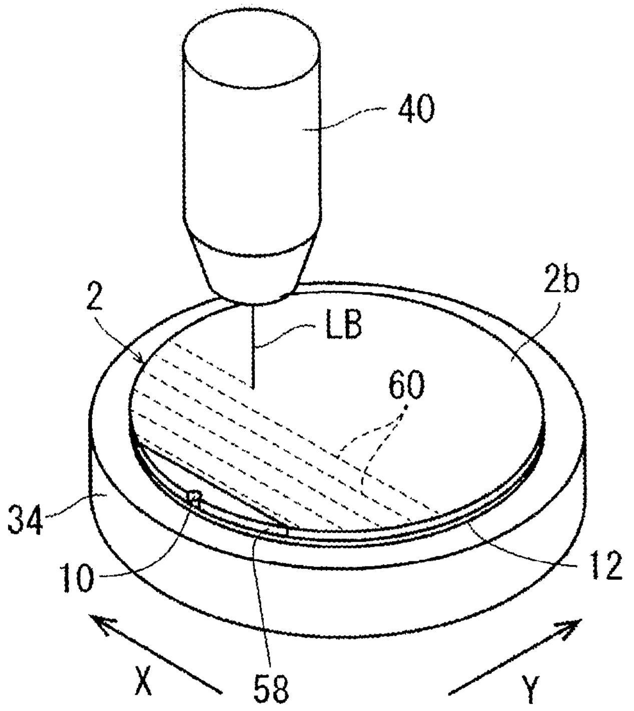
FIG. 6 is a perspective view depicting a modified layer forming step.

In the modified layer forming step, first, the sample piece 58 is returned into its original state (see FIG. 6). Next, the wafer 2 is positioned in such a manner as to cover the suction chuck 36 of the chuck table 34, and the wafer 2 is held under suction by the chuck table 34. Subsequently, IR rays are applied from the imaging unit 22, to image the device layer 4 side (the front surface side of the wafer 2) by using the IR rays transmitted from the back surface 2*b* of the wafer 2. Next, based on the image of the wafer 2 picked up by the imaging unit 22, the streets 8 are aligned with the X-axis direction. In addition, the laser beam LB is aimed at one of the streets 8 aligned with the X-axis direction, and the focal point of the laser beam LB is positioned at one of the positions set in the focal point position setting step.

After the focal point is positioned at the position set in the focal point position setting step, the laser beam LB is applied to the wafer 2 to form a modified layer along the street 8. Specifically, as depicted in FIG. 6, while the chuck table 34 is being fed in the X-axis direction, the laser beam LB of such a wavelength as to be transmitted through the wafer 2 is applied from the beam condenser 40 to the wafer 2. As a result, a modified layer 60 can be formed inside the wafer 2 along the street 8.

Figure 7:
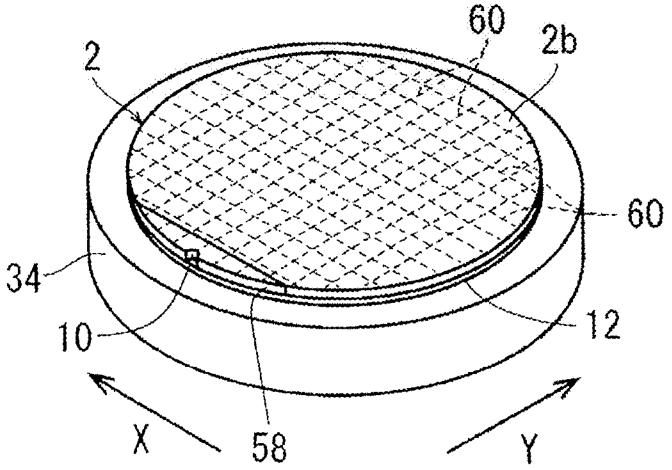
FIG. 7 is a perspective view of the wafer formed with modified layers.

Subsequently, the chuck table 34 is subjected to index feeding in the Y-axis direction by an amount of the interval of the streets 8 in the Y-axis direction. Then, the application of the laser beam LB and the index feeding are alternately repeated, so that modified layers 60 are formed inside the wafer 2 along all the streets 8 aligned with the X-axis direction. Then, the chuck table 34 is rotated by 90 degrees, after which the application of the laser beam LB and the index feeding are alternately repeated to form modified layers 60 inside the wafer 2 along all the streets 8 orthogonal to the streets 8 along which the modified layers 60 have been formed earlier, so that the modified layers 60 in a grid pattern are formed inside the wafer 2 along all the intersecting streets 8 (see FIG. 7).

Moreover, the height of the focal point is changed, after which the laser beam LB is applied to the wafer 2 in a manner similar to the manner described above. Then, the change of the height of the focal point and the application of the laser beam LB are repeated. Consequently, the modified layers 60 in the grid pattern are formed inside the wafer 2 at all the heights set in the focal point position setting step.

Note that the modified layer forming step can be carried out, for example, under the following processing conditions, as with the processing conditions in the trial modified layer forming step.

Wavelength of pulsed laser beam: 1,342 nm
Average output: 1.0 W
Repetition frequency: 90 KHz
Feed rate: 700 mm/s After the modified layer forming step is carried out, a dividing step is carried out in which an external force is exerted on the streets 8 to divide the wafer 2 into individual device chips.

Figure 8:
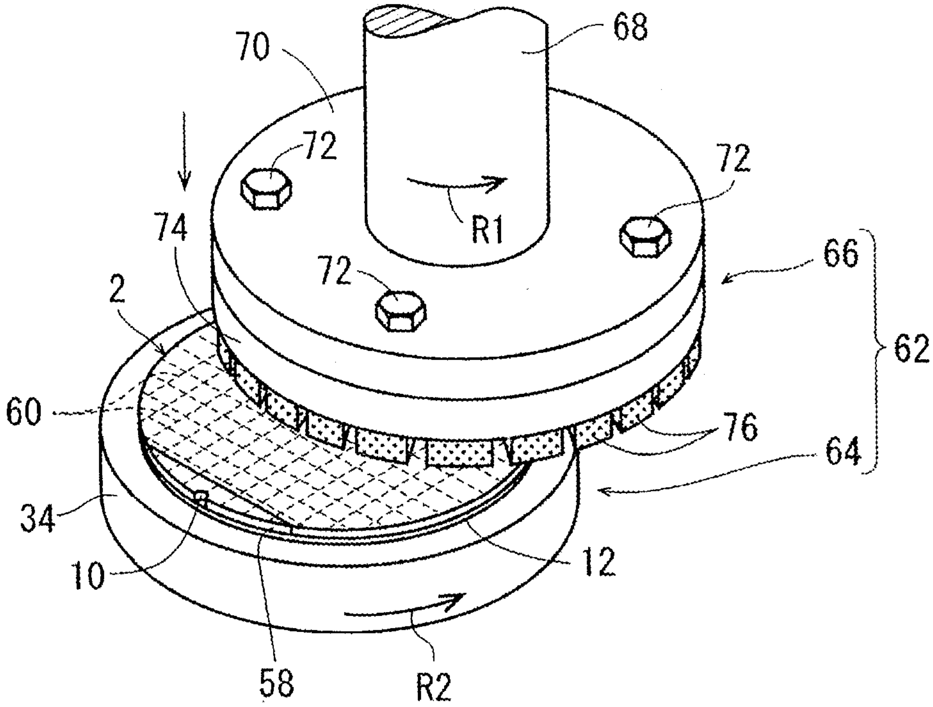
FIG. 8 is a perspective view depicting a dividing step.

The dividing step can be carried out, for example, by use of a grinding apparatus 62 depicted in FIG. 8. The grinding apparatus 62 includes a chuck table 64 that holds under suction the wafer 2, and a grinding unit 66 that grinds the wafer 2 held under suction by the chuck table 64. The grinding unit 66 includes a spindle 68 extending in the vertical direction, and a disk-shaped wheel mount 70 fixed to a lower end of the spindle 68. To a lower surface of the wheel mount 70, an annular grinding wheel 74 is fastened by bolts 72. On a peripheral edge part of a lower surface of the grinding wheel 74, a plurality of grindstones 76 arranged in an annular pattern at intervals in a circumferential direction are fixed.

In the dividing step, first, the wafer 2 is held under suction by an upper surface of the chuck table 64 with the back surface 2*b* of the wafer 2 directed upward. Next, the spindle 68 is rotated at a predetermined rotating speed (for example, 6,000 rpm) in a direction indicated by an arrow R1 in FIG. 8. In addition, the chuck table 64 is rotated at a predetermined rotating speed (for example, 300 rpm) in a direction indicated by an arrow R2.

Figure 9:
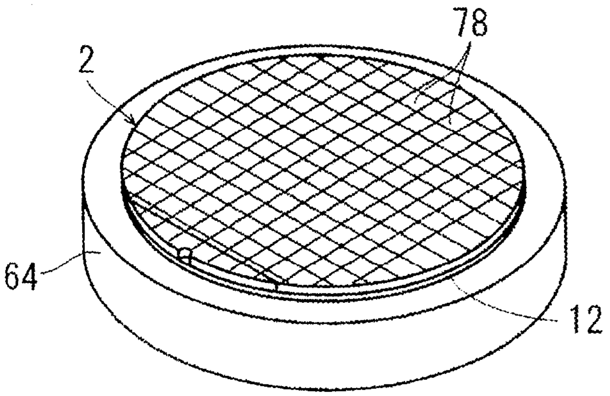
FIG. 9 is a perspective view of the wafer having been divided into device chips.

Subsequently, the spindle 68 is lowered to bring the grindstones 76 into contact with the back surface 2*b* of the wafer 2, and grinding water is supplied to an area where the grindstones 76 make contact with the back surface 2*b*. Thereafter, the spindle 68 is lowered at a predetermined grinding feed rate (for example, 1.0 μm/s), so that the back surface 2*b* of the wafer 2 is ground by the grindstones 76. As a result, the wafer 2 can be thinned to a predetermined thickness. In addition, since cracks extend in the thickness direction of the wafer 2 from the modified layers 60 due to an external force exerted by the grinding, the wafer 2 is divided into individual device chips 78 as depicted in FIG. 9.

As has been described above, in the present embodiment, the positions of the trial modified layers 56 in the thickness direction of the wafer 2 and the thickness of the device layer 4 are measured from the image of the section of the sample piece 58 to generate the measurement data, and the appropriate positions of the focal point of the laser beam LB are set based on the measurement data thus generated. Hence, the focal point of the laser beam LB can be positioned at the appropriate positions at the time of forming the modified layers 60 to be used to divide the wafer 2. Therefore, the devices 6 are not damaged during application of the laser beam LB to the wafer 2. In addition, in the dividing step, the devices 6 are not damaged even by the cracks that extend from the modified layers 60 when the external force is exerted on the wafer 2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer formed on a front surface thereof with a device layer in which a plurality of devices are formed in a state of being partitioned by a plurality of intersecting streets, the wafer processing method comprising:

a protective tape sticking step of sticking a protective tape to the front surface of the wafer;

a trial modified layer forming step of applying a laser beam of such a wavelength as to be transmitted through the wafer to the wafer from a back surface of the wafer with a focal point of the laser beam positioned inside the wafer, to thereby form a trial modified layer;

a sample piece forming step of exerting an external force along the trial modified layer to divide the wafer and form a sample piece;

a measurement data generating step of bending the sample piece to the protective tape side to expose a section of the sample piece, imaging the section by an imaging unit, and measuring position of the trial modified layer in a thickness direction of the wafer and a thickness of the device layer to generate measurement data;

a focal point position setting step of setting appropriate position inside the wafer at which to position the focal point of the laser beam, based on the measurement data;

a modified layer forming step of returning the sample piece into its original state and applying the laser beam to the wafer with the focal point of the laser beam positioned at the position set by the focal point position setting step, to thereby form modified layer; and a dividing step of exerting an external force on the streets to divide the wafer into individual device chips.

2. The wafer processing method according to claim 1, wherein, in the trial modified layer forming step, the trial modified layer is formed in a peripheral surplus region of the wafer.

3. The wafer processing method according to claim 1, wherein, in the dividing step, the back surface of the wafer is ground with use of grindstones to thin the wafer, and the wafer is divided into the individual device chips by an external force exerted by the grinding.

* * * * *